(12) United States Patent
Ling

(10) Patent No.: US 7,316,570 B2
(45) Date of Patent: Jan. 8, 2008

(54) HIGH PERFORMANCE EDGE CONNECTOR

(75) Inventor: Yun Ling, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/295,231

(22) Filed: Dec. 6, 2005

(65) Prior Publication Data

US 2007/0128891 A1 Jun. 7, 2007

(51) Int. Cl.
*H01R 12/00* (2006.01)

(52) U.S. Cl. .................. 439/59; 439/636; 439/637

(58) Field of Classification Search .................. 439/59, 439/62, 951, 636, 637
See application file for complete search history.

(56) References Cited

U.S. PATENT DOCUMENTS

| | | | | |
|---|---|---|---|---|
| 4,795,362 A | * | 1/1989 | Vonder et al. | 439/377 |
| 6,055,725 A | * | 5/2000 | Berto et al. | 29/879 |
| 6,234,807 B1 | * | 5/2001 | Amini et al. | 439/60 |
| 6,312,265 B1 | * | 11/2001 | Mohtar et al. | 439/79 |
| 6,447,338 B1 | * | 9/2002 | Bricaud et al. | 439/630 |
| 6,710,266 B2 | * | 3/2004 | Mix et al. | 174/261 |
| 6,941,649 B2 | * | 9/2005 | Goergen | 29/846 |

\* cited by examiner

*Primary Examiner*—Tho D. Ta
*Assistant Examiner*—Vanessa Girardi
(74) *Attorney, Agent, or Firm*—Rob Anderson of Intel Corporation

(57) ABSTRACT

In some embodiments, an electronic circuit card includes an edge connector positioned along an edge of the electronic circuit card, wherein the edge connector includes a conductive finger on an outer layer of the electronic circuit card, and a via positioned within the conductive finger, wherein the via electrically connects the conductive finger to another layer of the electronic circuit card. In some embodiments, an electronic circuit card includes an edge connector positioned along an edge of the electronic circuit card, wherein the edge connector includes a conductive finger having a stepped shape. In some embodiments, a connector housing defines a slot, and a plurality of contacts may be disposed inside the housing and positioned along at least one side of the slot, wherein the contacts include a contact surface which is relatively wider at respective interface points on the contacts. Other embodiments are disclosed and claimed.

27 Claims, 9 Drawing Sheets

HIGH PERFORMANCE EDGE CONNECTOR

The invention relates to edge connectors and systems utilizing edge connectors. More particularly, some embodiments of the invention relate to an edge connector with a via through a finger of the edge connector. Some embodiments of the invention relate to a finger of an edge connector having a stepped shape. Some embodiments of the invention relate to a connector having a contact surface which is relatively wider at an interface point.

BACKGROUND AND RELATED ART

Add-in cards having edge connectors are commonly used in computers and other electronic systems. A high speed bus generally requires a high-performance connector. One aspect that impacts the connector high frequency electrical performance may be the connector-to-add-in-card interface design. For example, PCI Express cards utilize an edge connector. As the PCI Express standard migrates to future generations with a higher data rate, further improvement in connector electrical performance may be beneficial.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
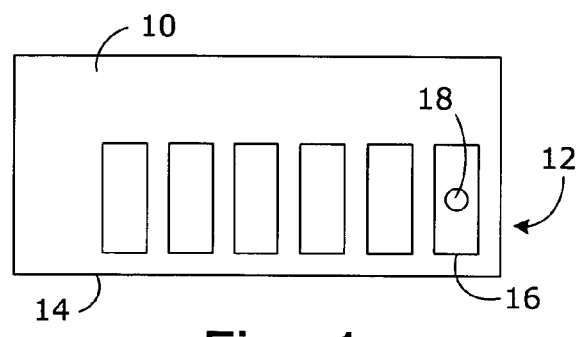
FIG. 1 is a schematic representation of an edge connector in accordance with some embodiments of the invention.

With reference to FIG. 1, an add-in card includes an electronic circuit card 10 and an edge connector 12 positioned along an edge 14 of the electronic circuit card 10. For example, the edge connector 12 may include a conductive finger 16 on an outer layer of the electronic circuit card 10 and a via 18 positioned within the conductive finger 16. For example, the via 18 may electrically connect the conductive finger 16 to another layer of the electronic circuit card 10. For example, the via 18 may electrically connect the conductive finger 16 to an internal layer of the electronic circuit card 10. In some embodiments, the via 18 may electrically connect the conductive finger 16 to an internal ground layer of the electronic circuit card 10.

In general terms, a via is a structure that connects one layer of a circuit card to another layer of the circuit card. For example, a via may include a plated through hole which passes through the thickness of the circuit card. Alternatively, a via may include a connection to an outer layer of the circuit card and one or more internal layers, but not passing through the thickness of the circuit card (sometimes referred to as a blind via).

Figure 2:
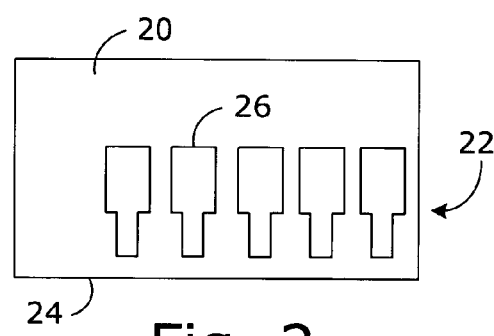
FIG. 2 is a schematic representation of another edge connector in accordance with some embodiments of the invention.

With reference to FIG. 2, an add-in card includes an electronic circuit card 20 and an edge connector 22 positioned along an edge 24 of the electronic circuit card 20. For example, the edge connector 22 may include a conductive finger 26 having a stepped shape. For example, the stepped shape may be relatively narrower near the edge 24 of the electronic circuit card 20. For example, as described in further detail herein, a system utilizing the add-in card of FIG. 2 may further include a system board and a connector on the system board configured to receive the edge connector 22 of the electronic circuit card 20, wherein the connector on the system board includes a contact having a contact surface which is relatively wider at an interface point.

Figure 3:
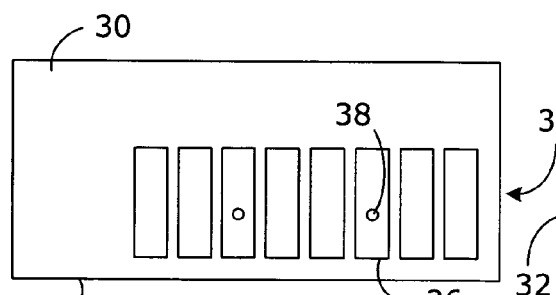
FIG. 3 is a schematic representation of another edge connector in accordance with some embodiments of the invention.
Figure 4:
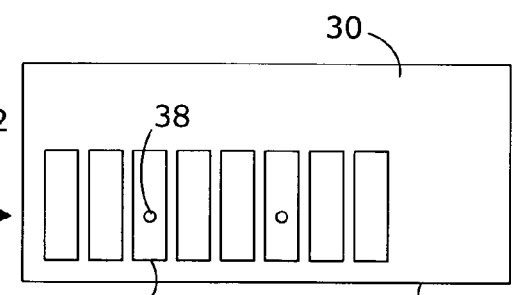
FIG. 4 is a schematic representation of an opposite side of the edge connector from FIG. 3.

With reference to FIGS. 3 and 4, an add-in card includes an electronic circuit card 30 and an edge connector 32 positioned along an edge 34 of the electronic circuit card 10.

For example, the edge connector 32 may include a conductive finger 36 on an outer layer of the electronic circuit card 30 and a via 38 positioned within the conductive finger 36. For example, the via 38 may electrically connect the conductive finger 36 to another layer of the electronic circuit card 30. For example, the via 38 may electrically connect the conductive finger 36 to an internal layer of the electronic circuit card 30. In some embodiments, the via 38 may electrically connect the conductive finger 36 to an internal ground layer of the electronic circuit card 30.

For example, some connector interface specifications may require a certain arrangement of the fingers, sometimes referred to as a pinout. In addition to particular finger assignments, the pinout may have a pattern with respect to the signal fingers and the ground fingers. For example, in FIGS. 3 and 4 the pinout has a pattern of two signal fingers (S) followed by a ground finger (G), which is implemented on both sides of the card 30 (e.g., the overall pattern is SSGSSGSS). Because the ground fingers (e.g. fingers 36 and 46) are aligned on opposite sides of the card 30, this connector pinout may be referred to as a non-offset pinout. Advantageously, with the non-offset pinout a single via in each ground fingers may be utilized to connect ground fingers on both sides of the card 30 to an internal ground layer. For example, the via 38 may connect both finger 36 and finger 46 to an internal ground layer.

Figure 5:
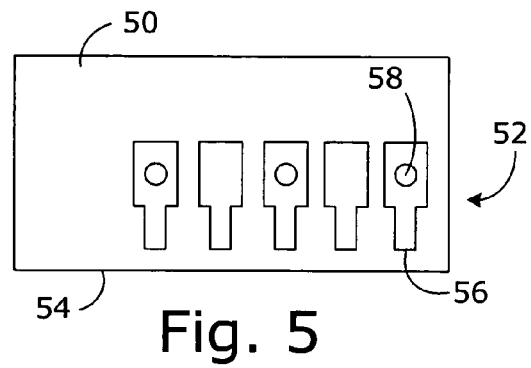
FIG. 5 is a schematic representation of another edge connector in accordance with some embodiments of the invention.

With reference to FIG. 5, an add-in card includes an electronic circuit card 50 and an edge connector 52 positioned along an edge 54 of the electronic circuit card 50. For example, the edge connector 52 may include a conductive finger 56 on an outer layer of the electronic circuit card 50 and a via 58 positioned within the conductive finger 56. For example, the via 58 may electrically connect the conductive finger 56 to another layer of the electronic circuit card 50. For example, the via 58 may electrically connect the conductive finger 56 to an internal layer of the electronic circuit card 50. In some embodiments, the via 58 may electrically connect the conductive finger 56 to an internal ground layer of the electronic circuit card 50. For example, the conductive finger 56 may have a stepped shape.

Figure 6:
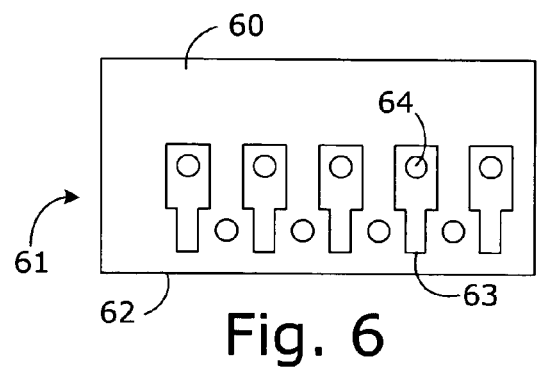
FIG. 6 is a schematic representation of another edge connector in accordance with some embodiments of the invention.
Figure 7:
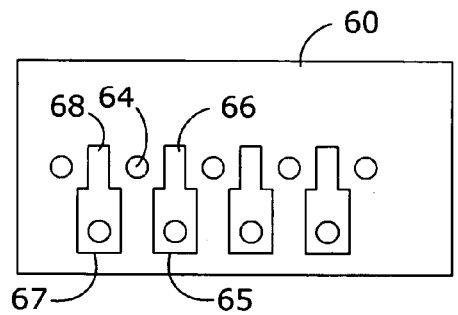
FIG. 7 is a schematic representation of an opposite side of the edge connector from FIG. 6.
Figure 8:
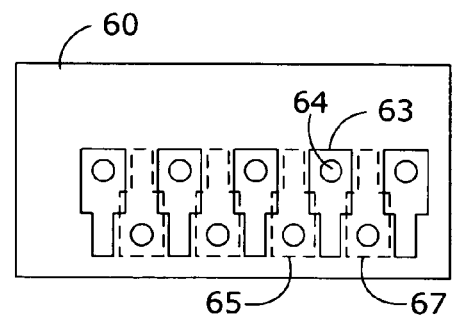
FIG. 8 is a schematic representation of the edge connector from FIG. 6, with hidden lines showing the relationship between fingers on both sides of the edge connector.

With reference to FIGS. 6-8, an add-in card includes an electronic circuit card 60 and an edge connector 61 positioned along an edge 62 of the electronic circuit card 60. For example, the edge connector 61 may include a first conductive finger 63 on an outer layer of the electronic circuit card 60 and a via 64 positioned within the conductive finger 63. For example, the via 64 may electrically connect the conductive finger 63 to another layer of the electronic circuit card 60. For example, the via 64 may electrically connect the conductive finger 63 to an internal layer of the electronic circuit card 60. In some embodiments, the via 64 may electrically connect the conductive finger 63 to an internal ground layer of the electronic circuit card 60. For example, the conductive finger 63 may have a stepped shape.

The add-in card 60 may further include a second conductive finger 65 having a stepped shape. For example, the second conductive finger 65 may be positioned on an opposite side of the electronic circuit card 60 with respect to the first conductive finger 63. The via 64 may be positioned to be proximate to a relatively narrower portion 66 of the stepped shape of the second conductive finger 65.

In some examples, the add-in card may further include a third conductive finger 67 having a stepped shape. The third conductive finger 67 may be positioned next to the second conductive finger 65 on the opposite side of the electronic circuit card 60 with respect to the first conductive finger 63. The via 64 may be positioned to be between relatively narrower portions 66 and 68 of the stepped shape of both the second and third conductive fingers 65 and 66.

As can be seen in FIG. 8, fingers on the opposite sides of the card 60 may be mirrored along an imaginary center line of the edge connector 61 (or rotated 180 degrees so that the stepped portions extend in opposite directions on opposite sides of the card 60). Advantageously, in some embodiments this arrangement may permit closer spacing of the fingers because the stepped shape provides clearance from the vias.

Figure 9:
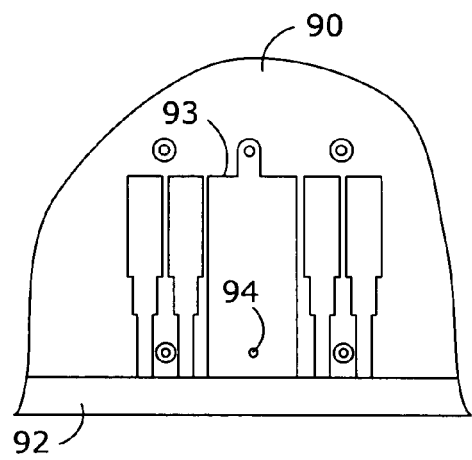
FIG. 9 is a schematic, partial representation of another edge connector in accordance with some embodiments of the invention.
Figure 10:
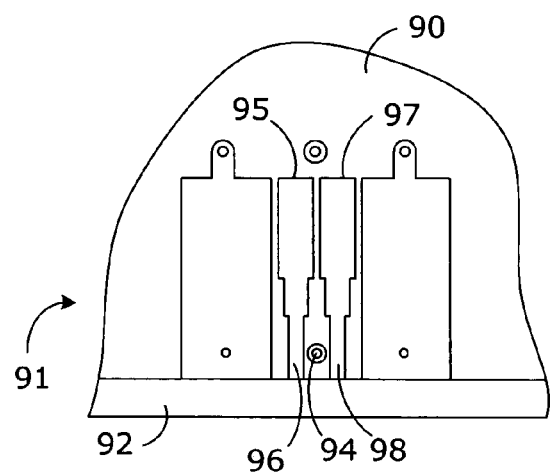
FIG. 10 is a schematic representation of an opposite side of the edge connector from FIG. 9.

With reference to FIGS. 9 and 10, an add-in card includes an electronic circuit card 90 and an edge connector 91 positioned along an edge 92 of the electronic circuit card 90. For example, the edge connector 91 may include a first conductive finger 93 on an outer layer of the electronic circuit card 90 and a via 94 positioned within the conductive finger 93. For example, the via 94 may electrically connect the conductive finger 93 to another layer of the electronic circuit card 90. For example, the via 94 may electrically connect the conductive finger 93 to an internal layer of the electronic circuit card 90. In some embodiments, the via 94 may electrically connect the conductive finger 93 to an internal ground layer of the electronic circuit card 90.

The add-in card 90 may further include a second conductive finger 95 having a stepped shape. For example, the second conductive finger 95 may be positioned on an opposite side of the electronic circuit card 90 with respect to the first conductive finger 93. The via 94 may be positioned to be proximate to a relatively narrower portion 96 of the stepped shape of the second conductive finger 95.

In some examples, the add-in card may further include a third conductive finger 97 having a stepped shape. The third conductive finger 97 may be positioned next to the second conductive finger 95 on the opposite side of the electronic circuit card 90 with respect to the first conductive finger 93. The via 94 may be positioned to be between relatively narrower portions 96 and 98 of the stepped shape of both the second and third conductive fingers 95 and 97.

For example, the finger 93 may be a ground finger and the fingers 95 and 97 may be respective signal fingers. Because the ground finger is opposite the signal fingers, the pinout pattern may be referred to as an offset pinout (e.g. on one side of the card the pattern is SSGGSSGG while on the other side of the card the pattern is GGSSGGSS). Note that the finger 93 may be a double wide finger configured to contact two ground terminals (e.g., GG in the pinout pattern). Advantageously, the stepped shape of the fingers 95 and 97 provides clearance for the via 94.

As illustrated in FIGS. 9 and 10, each of the ground fingers on the add-in card 90 may be connected to the card ground plane(s) by grounding vias. Preferably, the location of the grounding via reduces or minimizes the return path to reduce or avoid an unwanted resonance. Advantageously, the via 94 in the finger 93 reduces or minimizes the ground return path (and may provide the shortest possible path to the ground layer).

Figure 11:
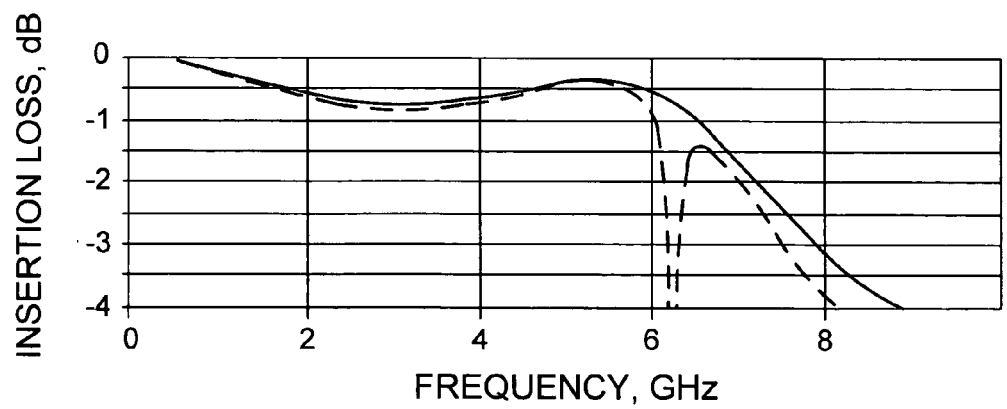
FIG. 11 is a comparison graph of insertion loss versus frequency.

For example, this implementation may be useful for a PCI Express edge connector. For example, the via 94 in the finger 93 may reduce or remove an unwanted resonance in a PCI Express edge connector. With reference to FIG. 11, the dashed line illustrates an unwanted resonance around 6 GHz. Such a resonance may be related to the ground return path, or the grounding via location in a conventional PCI Express edge connector (e.g. where the grounding via is located away from the ground finger). The solid line in FIG. 11 shows the insertion loss versus frequency for a PCI Express edge connector in accordance with some embodiments of the present invention (e.g. with the grounding via in the ground finger). As can be seen in FIG. 11, the solid line shows no unwanted resonance. Without being limited to theory of operation, it is believed that placing the grounding via in the finger may reduce or minimize the ground return path and the unwanted resonance may be removed from the frequency range of interest. Advantageously, the bandwidth of the connector may be greatly increased.

A problem with the long and wide fingers of conventional edge connectors is that the fingers may cause an impedance mismatch with growing negative impact to connector performance as the frequency increases. Advantageously, some embodiments of the invention may utilize a stepped finger with a wide pad at the top and a narrow pad at bottom which effectively reduces the metal area and therefore the stub effect. Without being limited to theory of operation, it is believed that by reducing the stub associated with conventional long, wide edge fingers, the stepped fingers of some embodiments of the present invention may improve the high frequency connector performance.

Figure 12:
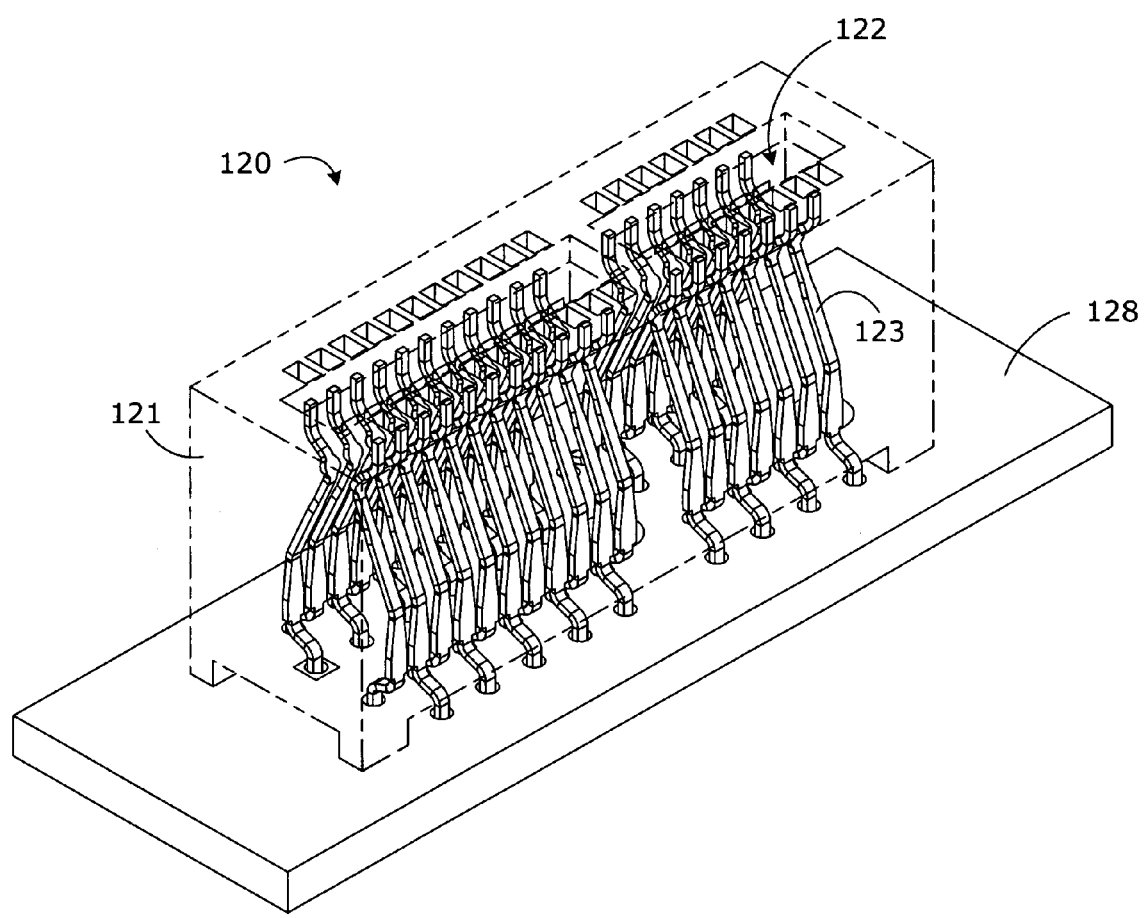
FIG. 12 is a perspective view of a connector according to some embodiments of the invention.
Figure 13:
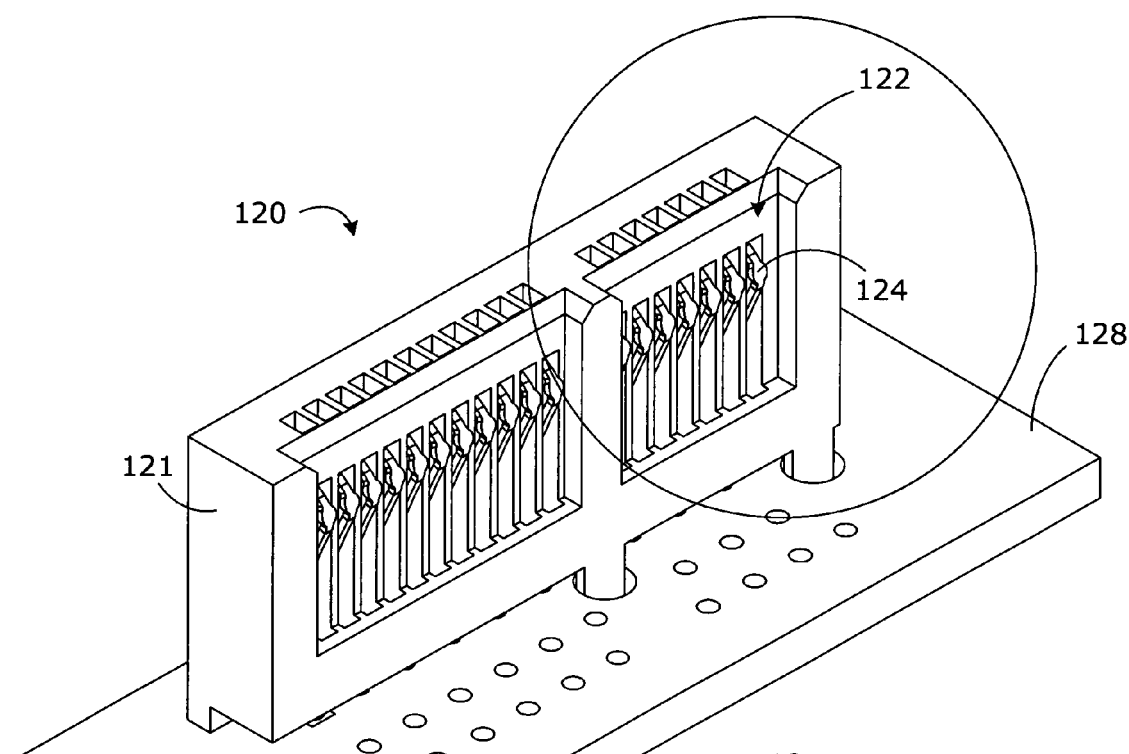
FIG. 13 is a cutaway, perspective view of the connection from FIG. 12.
Figure 14:
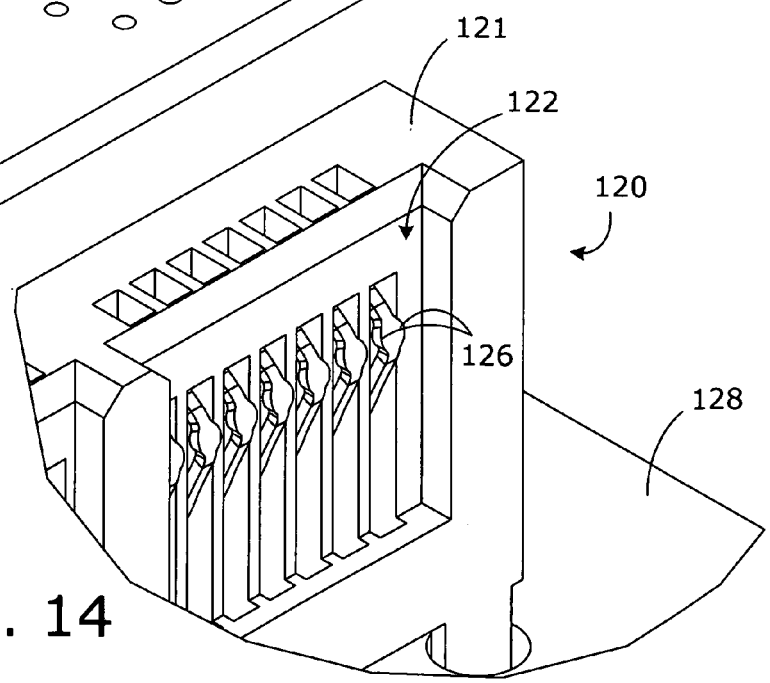
FIG. 14 is an enlarged, fragmented view of the area 14 from FIG. 13.
Figure 15:
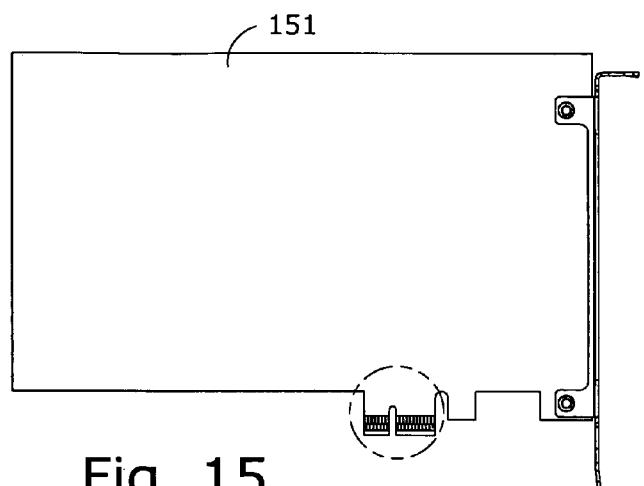
FIG. 15 is a side view of an add-in card, in accordance with some embodiments of the invention.
Figure 16:
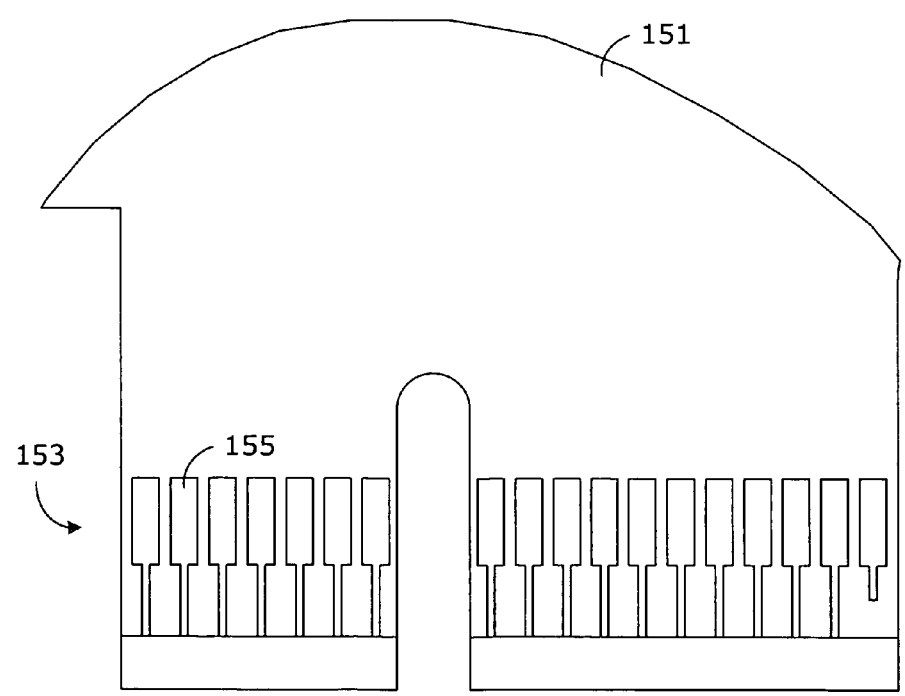
FIG. 16 is an enlarged, fragmented view of the area 16 in FIG. 15.
Figure 17:
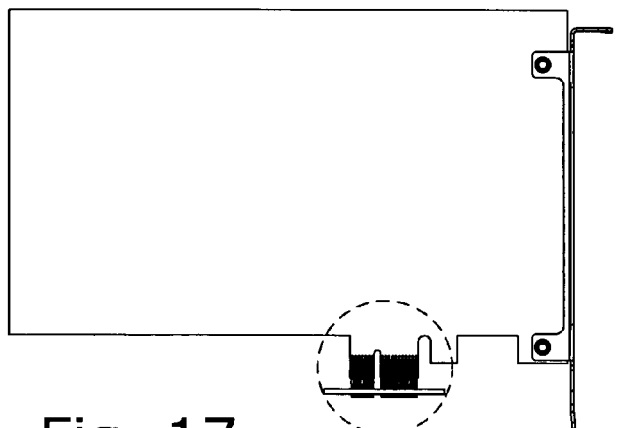
FIG. 17 is a side view of an electronic system, in accordance with some embodiments of the invention.
Figure 18:
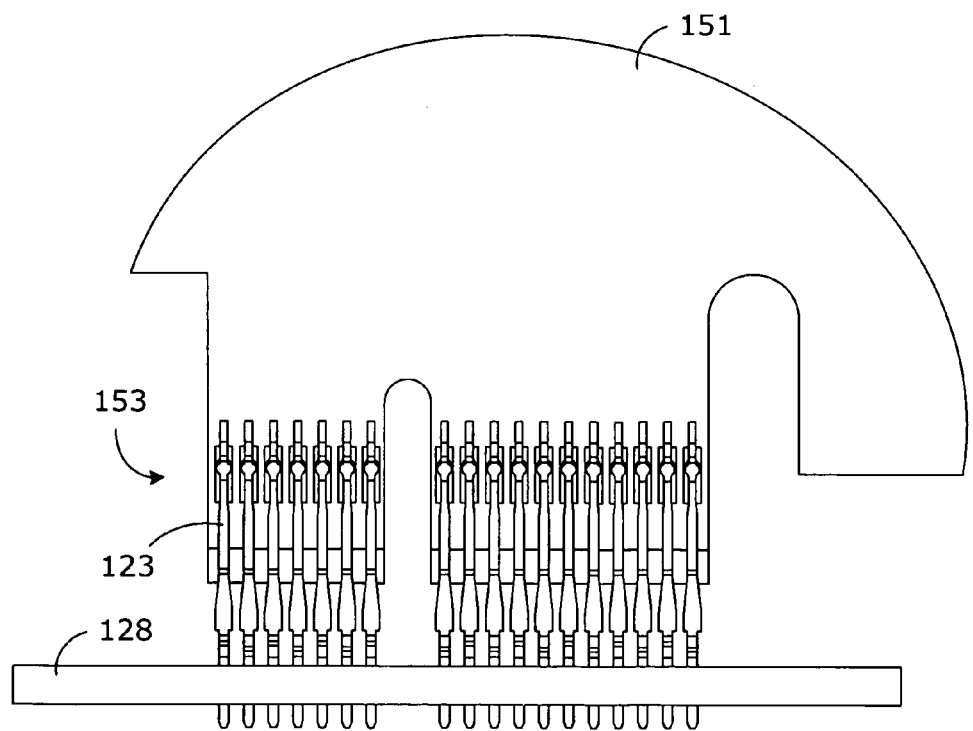
FIG. 18 is an enlarged, fragmented view of the area 18 in FIG. 17.
Figure 19:
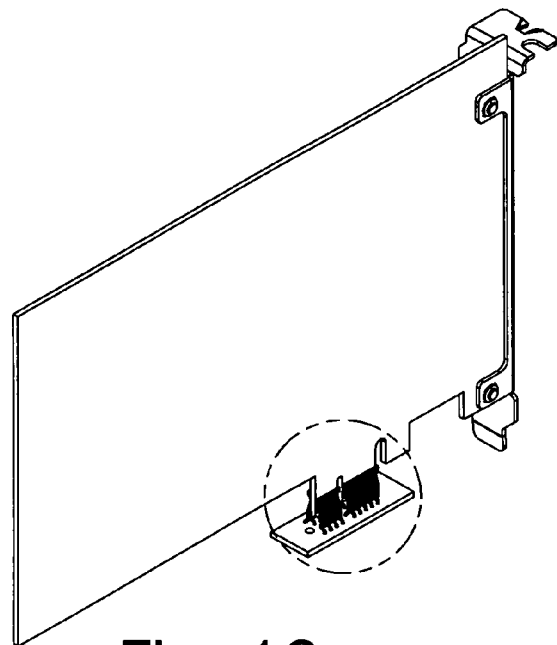
FIG. 19 is a perspective view of the electronic system from FIG. 17.
Figure 20:
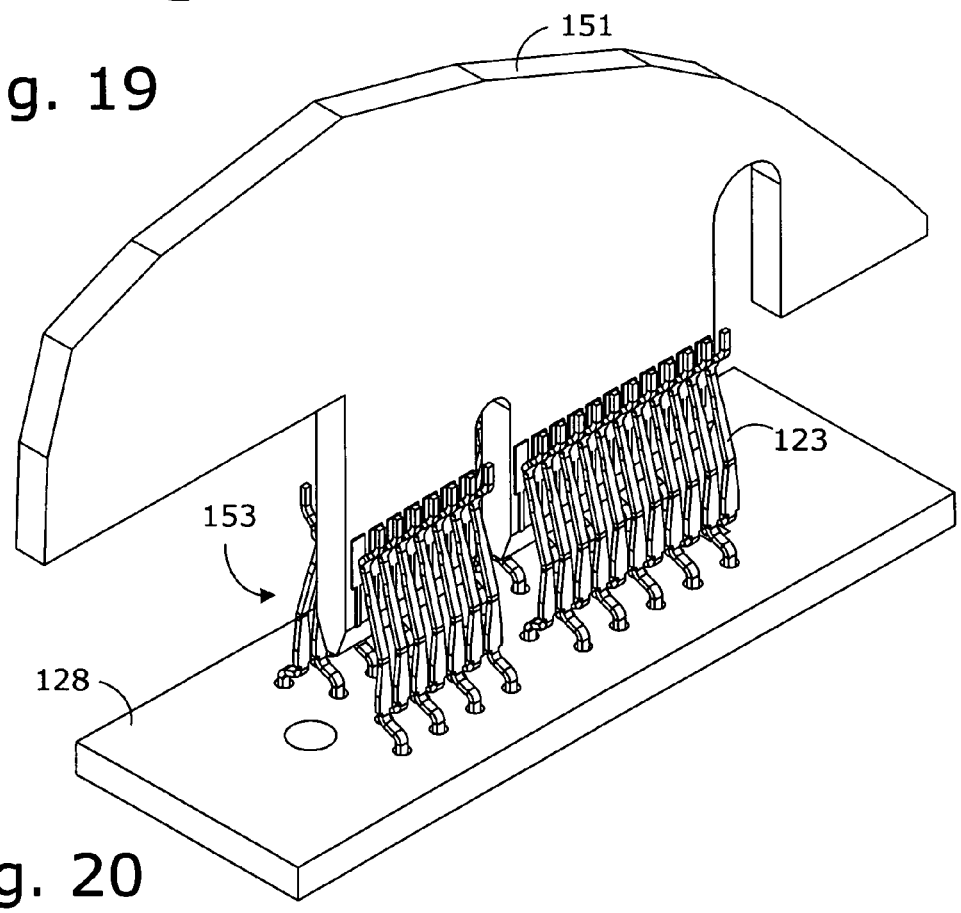
FIG. 20 is an enlarged, fragmented view of the area 20 in FIG. 19.

With reference to FIGS. 12-14, a connector 120 includes a connector housing 121 defining a slot 122. A plurality of contacts 123 may be disposed inside the housing 121 and positioned along at least one side of the slot 122. The contacts 123 may include a contact surface which is relatively wider at respective interface points 124 on the contacts 123. For example, the interface points 124 may include respective conductive protrusions 126 on both sides of the contacts 123. For example, the interface points 124 may include respective conductive circular regions on the contacts 123. The connector 120 may be mounted on a system board 128 which may be, for example, a motherboard of a computer system.

Some embodiments of the invention may balance the mechanical and electrical requirements of a high performance connector by utilizing a combination of a stepped finger (e.g. for signal fingers) and a wide contact mating surface. For example, the stepped finger with a wide pad at the top and a narrow pad at bottom effectively reduces the metal area and therefore the stub effect (e.g. for better electrical performance). The wider portion of the finger is where the contact point is located in normal circumstances. However, card lift-off may occur due to mechanical tolerance or shock and vibration and there are some probabilities that the contact point will lie in the narrow portion of the finger. To increase the likelihood of electrical continuity between the finger and the contact, the contact is designed with a wide contact surface in the mating area (e.g. for better mechanical performance). Advantageously, combining the stepped finger with the wide-surface contact may effectively reduce the edge-finger stub effect while providing good mechanical integrity of the interface.

With reference to FIGS. 15-20, several views illustrate how an example card 151 might interface with the example connector 120. As shown in detail in FIG. 16, the card 151 includes an edge connector 153 with a plurality of fingers 155 having a stepped shape. In FIGS. 17-20, the connector housing 121 is not illustrated in order to show details of the interface between the edge connector 153 and the contacts 123.

Figure 21:
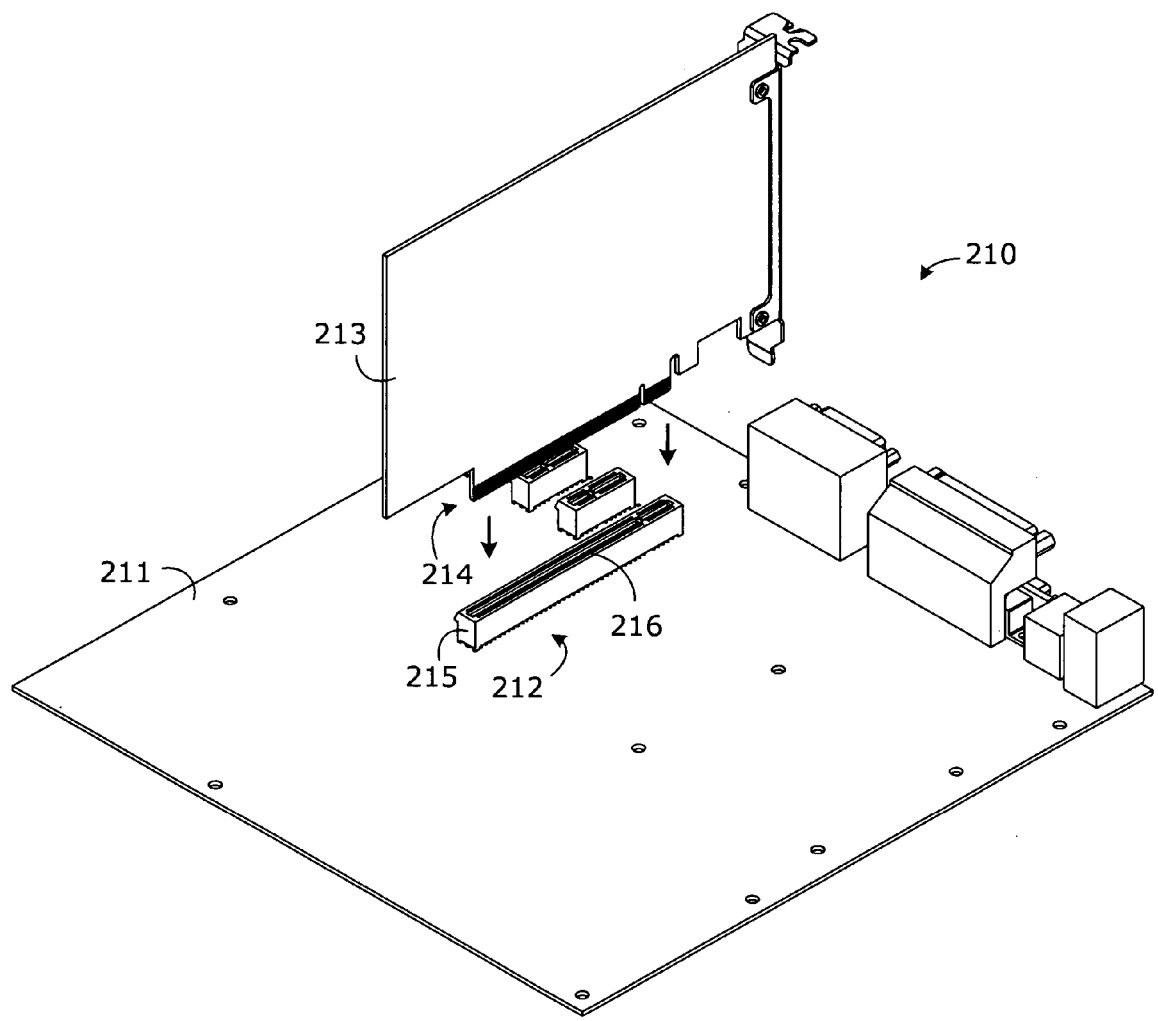
FIG. 21 is a perspective view of another electronic system, in accordance with some embodiments of the invention.

With reference to FIG. 21, an electronic system 210 includes a system board 211, a connector 212 on the system board 211, and an add-in card 213 having an edge connector 214 received in the connector 212 on the system board 211. For example, the edge connector 214 and connector 212 may have any of the configurations described above. For example, the edge connector 214 may include a conductive finger on an outer layer of the add-in card, and a via positioned within the conductive finger, wherein the via electrically connects the conductive finger to another layer of the add-in card. The via may electrically connect the conductive finger to an internal layer of the add-in card. For example, the via may electrically connect the conductive finger to an internal ground layer of the add-in card. In some examples, the conductive finger may have a stepped shape.

In some systems, the conductive finger may be a first conductive finger, and the edge connector may further include a second conductive finger having a stepped shape. For example, the second conductive finger may be positioned on an opposite side of the add-in card 213 with respect to the first conductive finger, and the via may be positioned to be proximate to a relatively narrower portion of the stepped shape of the second conductive finger.

In some systems, the edge connector 214 may further include a third conductive finger having a stepped shape. For example, the third conductive finger may be positioned next to the second conductive finger on the opposite side of the add-in card 213 with respect to the first conductive finger, and the via may be positioned to be between relatively narrower portions of the stepped shape of both the second and third conductive fingers. For example, the stepped shapes of the second and third conductive fingers may be relatively narrower near the edge of the electronic circuit card.

In some systems, the connector 212 on the system board 211 may include a housing 215 defining a slot 216, and a plurality of contacts disposed inside the housing and positioned along at least one side of the slot 216. The contacts may include a contact surface which is relatively wider at respective interface points on the contacts. For example, the interface points may include respective conductive protrusions on both sides of the contacts. For example, the interface points may include respective conductive circular regions on the contacts.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. An apparatus, comprising:
   an electronic circuit card; and
   an edge connector positioned along an edge of the electronic circuit card, wherein the edge connector includes:
     a conductive finger on an outer layer of the electronic circuit card, wherein the conductive finger has a stepped shape; and
     a via positioned within the conductive finger, wherein the via electrically connects the conductive finger to another layer of the electronic circuit card; and
   a system board; and
   a connector on the system board configured to receive the edge connector of the electronic circuit card, wherein the connector on the system board includes a contact having a contact surface which is relatively wider at an interface point as compared to portions of the contact immediately above and below the interface point.

2. The apparatus of claim 1, wherein the via electrically connects the conductive finger to an internal layer of the electronic circuit card.

3. The apparatus of claim 1, wherein the via electrically connects the conductive finger to an internal ground layer of the electronic circuit card.

4. The apparatus of claim 1, wherein the stepped shape is relatively narrower near the edge of the electronic circuit card.

5. The apparatus of claim 1, wherein the interface point includes conductive protrusions on both sides of the contact.

6. The apparatus of claim 1, wherein the interface point includes conductive circular regions on the contact.

7. The apparatus of claim 1, wherein the conductive finger is a first conductive finger, the apparatus further comprising:
a second conductive finger having a stepped shape.

8. The apparatus of claim 7, wherein the second conductive finger is positioned on an opposite side of the electronic circuit card with respect to the first conductive finger, and wherein the via is positioned to be proximate to a relatively narrower portion of the stepped shape of the second conductive finger.

9. The apparatus of claim 8, further comprising:
a third conductive finger having a stepped shape, the third conductive finger being positioned next to the second conductive finger on the opposite side of the electronic circuit card with respect to the first conductive finger, and wherein the via is positioned to be between relatively narrower portions of the stepped shape of both the second and third conductive fingers.

10. An apparatus, comprising:
an electronic circuit card; and
an edge connector positioned along an edge of the electronic circuit card, wherein the edge connector includes a conductive finger having a stepped shape, wherein the stepped shape is relatively narrower near the edge of the electronic circuit card;
a system board; and
a connector on the system board configured to receive the edge connector of the electronic circuit card, wherein the connector on the system board includes a contact having a contact surface which is relatively wider at an interface point as compared to portions of the contact immediately above and below the interface point.

11. The apparatus of claim 10, wherein the interface point includes conductive protrusions on both sides of the contact.

12. The apparatus of claim 10, wherein the interface point includes conductive circular regions on the contact.

13. An apparatus, comprising:
a connector housing defining a slot; and
a plurality of contacts disposed inside the housing and positioned along at least one side of the slot,
wherein the contacts include a contact surface which is relatively wider at respective interface points on the contacts as compared to portions of the contact immediately above and below the respective interface points; and
wherein the interface points include respective conductive protrusions on both sides of the contacts.

14. An apparatus, comprising:
a connector housing defining a slot; and
a plurality of contacts disposed inside the housing and positioned along at least one side of the slot,
wherein the contacts include a contact surface which is relatively wider at respective interface points on the contacts as compared to portions of the contact immediately above and below the respective interface points; and
wherein the interface points include respective conductive circular regions on the contacts.

15. A system, comprising:
a system board;
a connector on the system board; and
an add-in card having an edge connector received in the connector on the system board, wherein the edge connector includes:
a conductive finger on an outer layer of the add-in card; and
a via positioned within the conductive finger, wherein the via electrically connects the conductive finger to another layer of the add-in card;
wherein the connector on the system board comprises:
a housing defining a slot; and
a plurality of contacts disposed inside the housing and positioned along at least one side of the slot,
wherein the contacts include a contact surface which is relatively wider at respective interface points on the contacts as compared to portions of the contact immediately above and below the interface point.

16. The system of claim 15, wherein the via electrically connects the conductive finger to an internal layer of the add-in card.

17. The system of claim 15, wherein the via electrically connects the conductive finger to an internal ground layer of the add-in card.

18. The system of claim 15, wherein the conductive finger is a first conductive finger, the edge connector further comprising:
a second conductive finger having a stepped shape.

19. The system of claim 15, wherein the interface points include respective conductive protrusions on both sides of the contacts.

20. The system of claim 15, wherein the interface points include respective conductive circular regions on the contacts.

21. The apparatus of claim 15, wherein the conductive finger has a stepped shape.

22. The system of claim 21, wherein the second conductive finger is positioned on an opposite side of the add-in card with respect to the first conductive finger, and wherein the via is positioned to be proximate to a relatively narrower portion of the stepped shape of the second conductive finger.

23. The system of claim 22, further comprising:
a third conductive finger having a stepped shape, the third conductive finger being positioned next to the second conductive finger on the opposite side of the add-in card with respect to the first conductive finger, and wherein the via is positioned to be between relatively narrower portions of the stepped shape of both the second and third conductive fingers.

24. The system of claim 23, wherein the stepped shapes of the second and third conductive fingers are relatively narrower near the edge of the electronic circuit card.

25. A system, comprising:
a system board;
a connector on the system board; and
an add-in card having an edge connector received in the connector on the system board, wherein the edge connector includes:
a conductive finger on an outer layer of the add-in card; and a via positioned within the conductive finger, wherein the via electrically connects the conductive finger to another layer of the add-in card;

wherein the conductive finger has a stepped shape;

wherein the second conductive finger is positioned on an opposite side of the add-in card with respect to the first conductive finger, and wherein the via is positioned to be proximate to a relatively narrower portion of the stepped shape of the second conductive finger;

further comprising a third conductive finger having a stepped shape, the third conductive finger being positioned next to the second conductive finger on the opposite side of the add-in card with respect to the first conductive finger, and wherein the via is positioned to be between relatively narrower portions of the stepped shape of both the second and third conductive fingers;

wherein the stepped shapes of the second and third conductive fingers are relatively narrower near the edge of the electronic circuit card; and wherein the connector on the system board comprises:

a housing defining a slot; and a plurality of contacts disposed inside the housing and positioned along at least one side of the slot, wherein the contacts include a contact surface which is relatively wider at respective interface points on the contacts as compared to portions of the contact immediately above and below the interface point.

26. The system of claim 25, wherein the interface points include respective conductive protrusions on both sides of the contacts.

27. The system of claim 25, wherein the interface points include respective conductive circular regions on the contacts.

* * * * *